(12) United States Patent
Park et al.

(10) Patent No.: US 12,272,555 B2
(45) Date of Patent: Apr. 8, 2025

(54) METHODS OF FORMING SEMICONDUCTOR DEVICES

(71) Applicant: Samsung Electronics Co., Ltd., Suwon-si (KR)

(72) Inventors: Jinyoung Park, Anyang-si (KR); Jungpyo Hong, Gwangmyeong-si (KR); Yangdoo Kim, Seoul (KR); Yonghwan Kim, Hwaseong-si (KR); Sangwuk Park, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 378 days.

(21) Appl. No.: 17/938,684

(22) Filed: Oct. 7, 2022

(65) Prior Publication Data
US 2023/0110190 A1 Apr. 13, 2023

(30) Foreign Application Priority Data
Oct. 12, 2021 (KR) .................. 10-2021-0135216

(51) Int. Cl.
*H01L 21/033* (2006.01)
*H01L 21/027* (2006.01)
*H01L 21/3065* (2006.01)
*H01L 21/308* (2006.01)
*H01L 21/311* (2006.01)
*H01L 21/3213* (2006.01)

(52) U.S. Cl.
CPC ...... *H01L 21/0337* (2013.01); *H01L 21/0276* (2013.01); *H01L 21/0332* (2013.01); *H01L 21/3065* (2013.01); *H01L 21/3086* (2013.01); *H01L 21/31116* (2013.01); *H01L 21/31144* (2013.01); *H01L 21/32136* (2013.01); *H01L 21/32139* (2013.01)

(58) Field of Classification Search
None
See application file for complete search history.

(56) References Cited

U.S. PATENT DOCUMENTS

| | | | |
|---|---|---|---|
| 5,447,598 A | 9/1995 | Mihara et al. | |
| 8,501,627 B2 | 8/2013 | Chi et al. | |
| 10,490,415 B2 | 11/2019 | Imamura et al. | |
| 10,847,376 B2 | 11/2020 | Osawa et al. | |
| 10,923,360 B2 | 2/2021 | Katsunuma | |
| 2003/0024902 A1* | 2/2003 | Li ................. | H01L 21/31116 257/E21.252 |

(Continued)

FOREIGN PATENT DOCUMENTS

| | | |
|---|---|---|
| JP | H0786285 A | 3/1995 |
| JP | H0950984 A | 2/1997 |
| KR | 10-1528947 B1 | 6/2015 |

*Primary Examiner* — Jiong-Ping Lu
(74) *Attorney, Agent, or Firm* — Myers Bigel, P.A.

(57) ABSTRACT

Methods of forming a semiconductor device may include: providing a substrate on which a layer is formed; forming a lower hard-mask layer, which includes silicon, on the layer; forming an upper hard-mask pattern, which includes oxide, on the lower hard-mask layer; forming a lower hard-mask pattern by etching the lower hard-mask layer using the upper hard-mask pattern as an etch mask and using an etching gas that includes a metal-chloride-based first gas and a nitride-based second gas; and forming a plurality of contact holes in the layer by etching the material layer using the lower hard-mask pattern as an etch mask.

20 Claims, 18 Drawing Sheets

(56) References Cited

U.S. PATENT DOCUMENTS

| | | |
|---|---|---|
| 2007/0232070 A1 | 10/2007 | Wege et al. |
| 2012/0115331 A1* | 5/2012 | Koh ................ H10B 41/30 257/E21.259 |
| 2020/0176246 A1 | 6/2020 | Huotari et al. |
| 2020/0294806 A1 | 9/2020 | Cheng et al. |
| 2020/0350414 A1 | 11/2020 | Lee et al. |
| 2021/0005472 A1 | 1/2021 | Kanarik et al. |
| 2021/0151301 A1 | 5/2021 | Niizeki et al. |

* cited by examiner

METHODS OF FORMING SEMICONDUCTOR DEVICES

CROSS-REFERENCE TO RELATED APPLICATION

This application is based on and claims priority under 35 U.S.C. § 119 to Korean Patent Application No. 10-2021-0135216, filed on Oct. 12, 2021, in the Korean Intellectual Property Office, the disclosure of which is incorporated by reference herein in its entirety.

BACKGROUND

The present disclosure relates to a method of forming a semiconductor device, and more particularly, to a method of forming a contact hole with a high aspect ratio.

High performance, high-capacity semiconductor devices may be desirable for small and multi-functional electronic devices. Accordingly, an integration density of semiconductor devices has increased, and design rules of semiconductor devices have become tight. Semiconductor devices, therefore, may include contact holes with high aspect ratios. It may be complicate and difficult to form contact holes with high aspect ratios using a hard mask having a poor profile.

SUMMARY

Provided are methods of forming semiconductor devices (e.g., a pattern of a semiconductor device), the method improving a mask profile (e.g., hard mask profile) used for a process of forming a contact hole with a high aspect ratio by using a mask pattern (e.g., a hard mask pattern) with high selectivity.

The present disclosure is not limited to the aspects set forth above, and additional aspects will be set forth in part in the description which follows and, in part, will be apparent from the description, or may be learned by practice of the presented embodiments.

According to some embodiments, a method of forming a semiconductor device (e.g., a pattern of a semiconductor device may include: preparing a substrate (e.g., a semiconductor substrate), on which a material layer is formed; forming a lower hard-mask forming layer, which includes silicon (Si), on the material layer; forming an upper hard-mask pattern, which includes oxide, on the lower hard-mask forming layer; forming a lower hard-mask pattern by etching the lower hard-mask forming layer using the upper hard-mask pattern as an etch mask and using, as an etching gas, a first gas, which includes a metal-chloride, and a second gas, which include nitrogen; and forming a plurality of contact holes in the material layer by etching the material layer using the lower hard-mask pattern as an etch mask.

According to some embodiments, a method of forming a semiconductor device (e.g., a pattern of a semiconductor device) may include: preparing a substrate (e.g., a semiconductor substrate); forming a mold layer and a support forming layer on the semiconductor device; forming a mask layer (e.g., a hard-mask forming layer) on the support forming layer; forming a mask pattern by etching the mask layer using titanium chloride ($TiCl_4$) gas and ammonia ($NH_3$) gas as an etching gas; forming a plurality of contact holes to expose the substrate by etching the mold layer and the support forming layer by using the mask pattern as an etch mask; and forming a plurality of conductors (e.g., lower electrodes of capacitors) by forming a conductive material in (e.g., on an inner wall of) each of the plurality of contact holes.

According to some embodiments, a method of forming a semiconductor device (e.g., a pattern of a semiconductor device) may include: preparing a semiconductor substrate, on which a material layer is formed; forming a lower hard-mask forming layer on the material layer, the lower hard-mask forming layer including silicon boride and silicon (Si); forming an upper hard-mask forming layer on the lower hard-mask forming layer, the upper hard-mask forming layer including silicon oxide; forming a photoresist pattern on the upper hard-mask forming layer; forming an upper hard-mask pattern by etching the upper hard-mask forming layer by using the photoresist pattern as an etch mask; forming a lower hard-mask pattern by etching the lower hard-mask forming layer by using the upper hard-mask pattern as an etch mask and using, as an etching gas, titanium chloride ($TiCl_4$) gas and ammonia ($NH_3$) gas; forming a plurality of contact holes in the material layer by etching the material layer by using the upper and lower hard-mask patterns as an etch mask; and removing the upper and lower hard-mask patterns.

BRIEF DESCRIPTION OF THE DRAWINGS

Example embodiments of the inventive concept will be more clearly understood from the following detailed description taken in conjunction with the accompanying drawings in which.

DETAILED DESCRIPTION

Hereinafter, example embodiments of the present invention will be described in detail with reference to the accompanying drawings.

As used herein, the term "high aspect ratio" refers to a depth-to-width (or a depth to diameter) ratio of about 10:1 or higher, and the term "high selectivity" refers to an etch selectivity of about 5:1 or higher. Further, as used herein, the term "low aspect ratio" refers to a depth-to-width (or a depth to diameter) ratio that is less than about 10:1, and the term "low selectivity" refers to an etch selectivity that is less than about 5:1.

Figure 1:
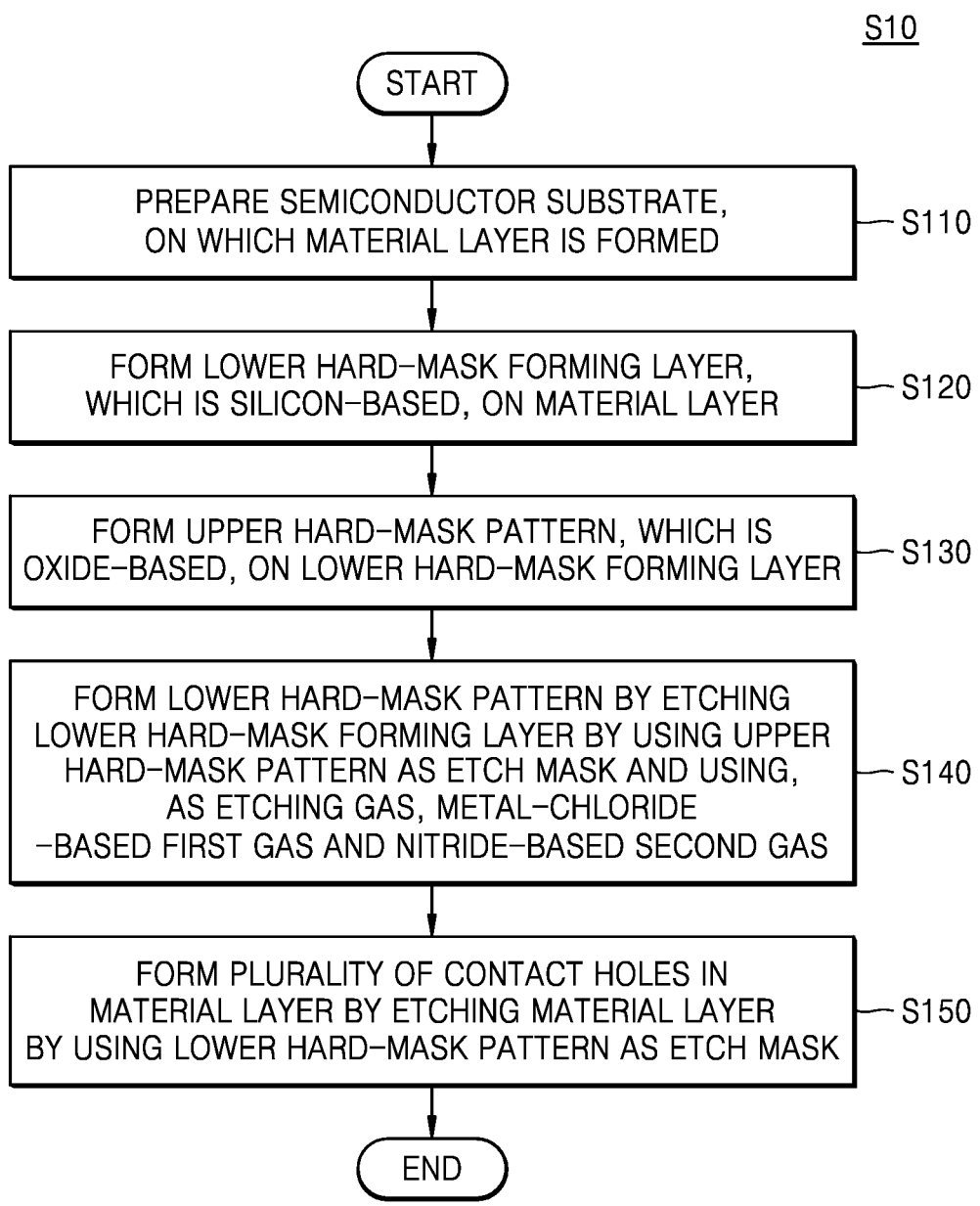
FIG. 1 is a flowchart illustrating a method of forming a semiconductor device, according to an embodiment of the present invention.

FIG. 1 is a flowchart illustrating a method of forming a pattern of a semiconductor device, according to an embodiment of the present invention.

Referring to FIG. 1, a method S10 of forming a semiconductor device (e.g., a method of forming a pattern of a semiconductor device) may include first to fifth operations S110 to S150. In some embodiments, those first to fifth operations S110 to S150 may be sequentially performed processes.

In some embodiments, specific processes may be performed differently from a described order. For example, two processes described in succession may be performed substantially at the same time, or may be performed in reverse order with respect to a described order.

According to the present invention, the method S10 of forming a pattern of a semiconductor device may include: a first operation S110 of providing (e.g., preparing) a semiconductor substrate, on which a layer (e.g., a layer including material(s)) is formed; a second operation S120 of forming a lower mask layer (e.g., a lower hard-mask layer or a lower hard-mask forming layer), which is silicon-based, on the layer; a third operation S130 of forming an upper mask pattern (e.g., an upper hard-mask pattern), which is oxide-based, on the lower mask layer; a fourth operation S140 of forming a lower mask pattern (e.g., a lower hard-mask pattern) by etching the lower mask layer by using the upper mask pattern as an etch mask and using an etching gas that may include a first gas, which is metal-chloride-based, and a second gas, which is nitride-based; and a fifth operation S150 of forming a plurality of contact holes in the layer by etching the layer by using the lower mask pattern as an etch mask. In some embodiments, the first gas may include metal and chlorine, and the second gas may include nitrogen. As used herein, "an A-based gas or layer" (or similar language) may refer to a gas or layer including the element or compound A. For example, a silicon-based lower mask layer refers to a layer including silicon, and a metal-chloride-based gas refers to a gas including a metal-chloride. Throughout this specification, the layer in which contact holes are formed, the lower mask layer, the upper mask pattern, and the lower mask pattern may be also referred to as a material layer, a lower hard-mask forming layer, an upper hard-mask pattern, and a lower hard-mask pattern, respectively.

Small and multi-functional electronic devices and high performance and high-capacity semiconductor devices are preferred in the electronics industry, and thus an integration density of semiconductor devices has increased, and design rules of semiconductor devices have become tight. Accordingly, semiconductor devices may include contact holes with high aspect ratios. It may be complicate and difficult to form contact holes with high aspect ratios using a hard mask having a poor profile.

According to the method S10 of forming a pattern of a semiconductor device, in accordance with the present invention, a metallic protective layer capable of protecting a sidewall of a hard-mask pattern may be formed in the process of performing dry etching for forming a contact hole having a high aspect ratio in an etching target layer by using the hard-mask pattern that is silicon (Si)-based, thereby improving a poor hard mask profile generated (e.g., formed) in forming the contact hole having a high aspect ratio.

Descriptions of the first to fifth operations S110 to S150 set forth above will be made below in detail with reference to FIGS. 2 to 9.

FIGS. 2 to 9 are cross-sectional views illustrating a method of forming a pattern of a semiconductor device, according to an embodiment of the present invention.

Figure 2:
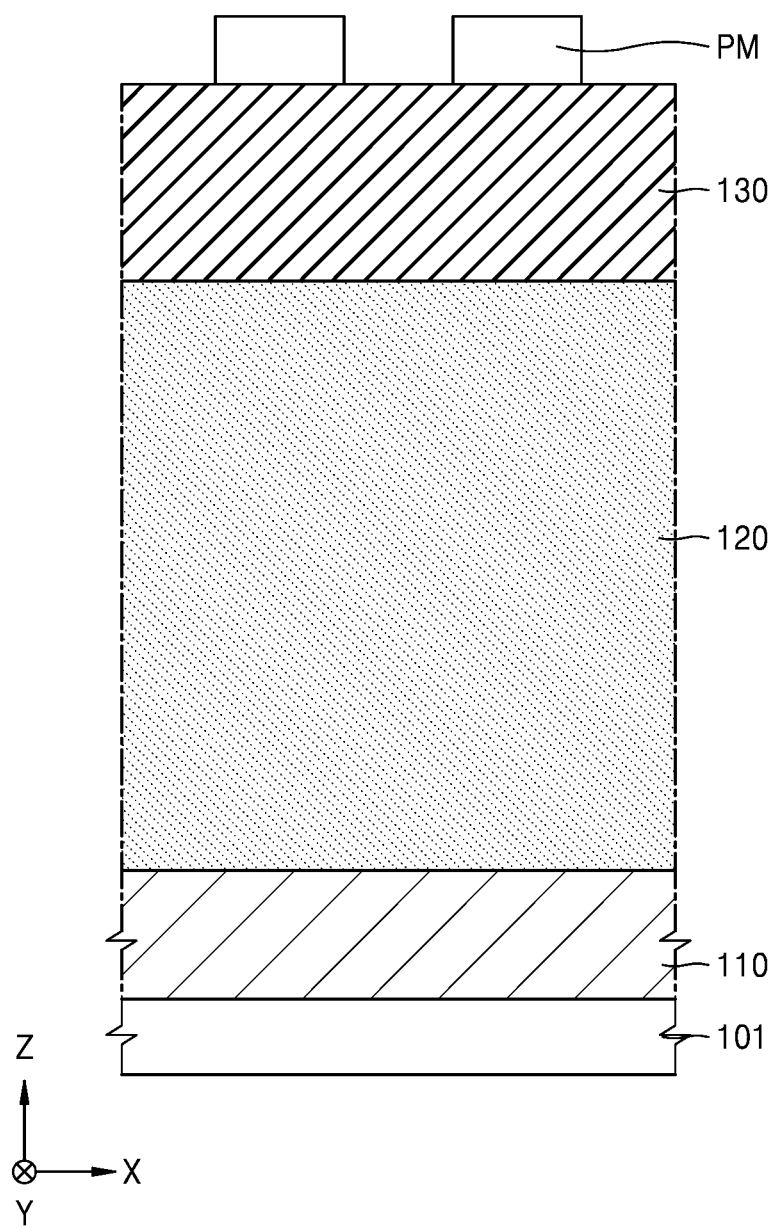
FIGS. 2 to 9 are cross-sectional views illustrating a method of forming a semiconductor device, according to an embodiment of the present invention.

Referring to FIG. 2, a material layer 110, a lower hard-mask forming layer 120, an upper hard-mask forming layer 130, and a photomask pattern PM may be sequentially formed on a semiconductor substrate 101 in the stated order.

The semiconductor substrate 101 may include a semiconductor material, for example, silicon (Si). In some embodiments, the semiconductor substrate 101 may include a semiconductor element material such as germanium (Ge), and/or a compound semiconductor material such as silicon carbide (SiC), gallium arsenide (GaAs), indium arsenide (InAs), and/or indium phosphide (InP). In some embodiments, the semiconductor substrate 101 may have a silicon-on-insulator (SOI) structure. The semiconductor substrate 101 may include a conductive region, for example, an impurity-doped well, an impurity-doped structure, or the like. As used herein the term "and/or" includes any and all combinations of one or more of the associated listed items.

A semiconductor device may be arranged on the semiconductor substrate 101. The semiconductor device may include a memory device and/or a logic device. In addition, the semiconductor device may include a plurality of individual devices of various types. The plurality of individual devices may include, for example, at least one of a transistor, a diode, a capacitor, or a resistor.

The material layer 110 may be formed on the semiconductor substrate 101. In some embodiments, the material layer 110 is an etching target layer and may include an insulating material. For example, the material layer 110 may be formed by forming silicon oxide ($Si_xO_y$) or silicon nitride ($Si_xN_y$) alone or by alternately stacking silicon oxide ($Si_xO_y$) and silicon nitride ($Si_xN_y$). The material layer 110 may be an interlayer dielectric (ILD), an inter-metal dielectric (IMD), a device isolation film of a semiconductor device, or the like, according to a forming method thereof and a purpose thereof.

The type and purpose of the material layer 110 are not limited to those described herein. In some embodiments, the material layer 110 is an etching target layer and may include a conductive material. The material layer 110 may be formed of tungsten (W), a tungsten alloy, copper (Cu), or a copper alloy. In some embodiments, the material layer 110 may include aluminum (Al), titanium (Ti), tantalum (Ta), palladium (Pd), platinum (Pt), molybdenum (Mo), a metal silicide, or a combination thereof.

The lower hard-mask forming layer 120 may be formed on the material layer 110. The lower hard-mask forming layer 120 may include a material having high etch selectivity, that is, high selectivity, with respect to the material layer 110. In general, various silicon-based materials and/or materials obtained by adding impurities to silicon-based materials may be used as the lower hard-mask forming layer 120. In an embodiment of the present invention, the lower hard-mask forming layer 120 may include, for example, a material including silicon boride and silicon (Si). However, the lower hard-mask forming layer 120 is not limited thereto and may include various material(s).

The upper hard-mask forming layer 130 may be formed on the lower hard-mask forming layer 120. In general, various oxide-based insulating materials may be used as the upper hard-mask forming layer 130. In an embodiment of the present invention, the upper hard-mask forming layer 130 may include silicon oxide ($Si_xO_y$). For example, the upper hard-mask forming layer 130 may include a material such as borophosphosilicate glass (BPSG), a spin-on dielectric (SOD), phosphosilicate glass (PSG), low-pressure tetraethyl orthosilicate (LPTEOS), and/or plasma-enhanced tetraethyl orthosilicate (PE-TEOS). However, the upper hard-mask forming layer 130 is not limited thereto.

In some embodiments, a thickness (e.g., a thickness in the Z direction) of the lower hard-mask forming layer 120 may be greater than a thickness (e.g., a thickness in the Z direction) of the upper hard-mask forming layer 130.

A photoresist may be applied on the upper hard-mask forming layer 130 and patterned by exposure and development processes, thereby forming the photomask pattern PM. A region to be etched in the material layer 110, which is an etching target layer, may be defined by the photomask pattern PM. In some embodiments, an anti-reflective coating (ARC) (not shown) may be formed between the upper hard-mask forming layer 130 and the photoresist. The photomask pattern may be also referred to as a photoresist pattern.

In some embodiments, a photoresist may be used in positive-tone development, and an exposed portion (that is, a portion onto which a threshold amount or more of light is irradiated) may be removed by a solvent, and an unexposed portion (that is, a portion onto which the threshold amount or more of light is not irradiated) may not be completely removed and may remain. However, the present invention is not limited thereto. In some embodiments, a photoresist may be used in negative-tone development to form the photomask pattern PM.

Figure 3:
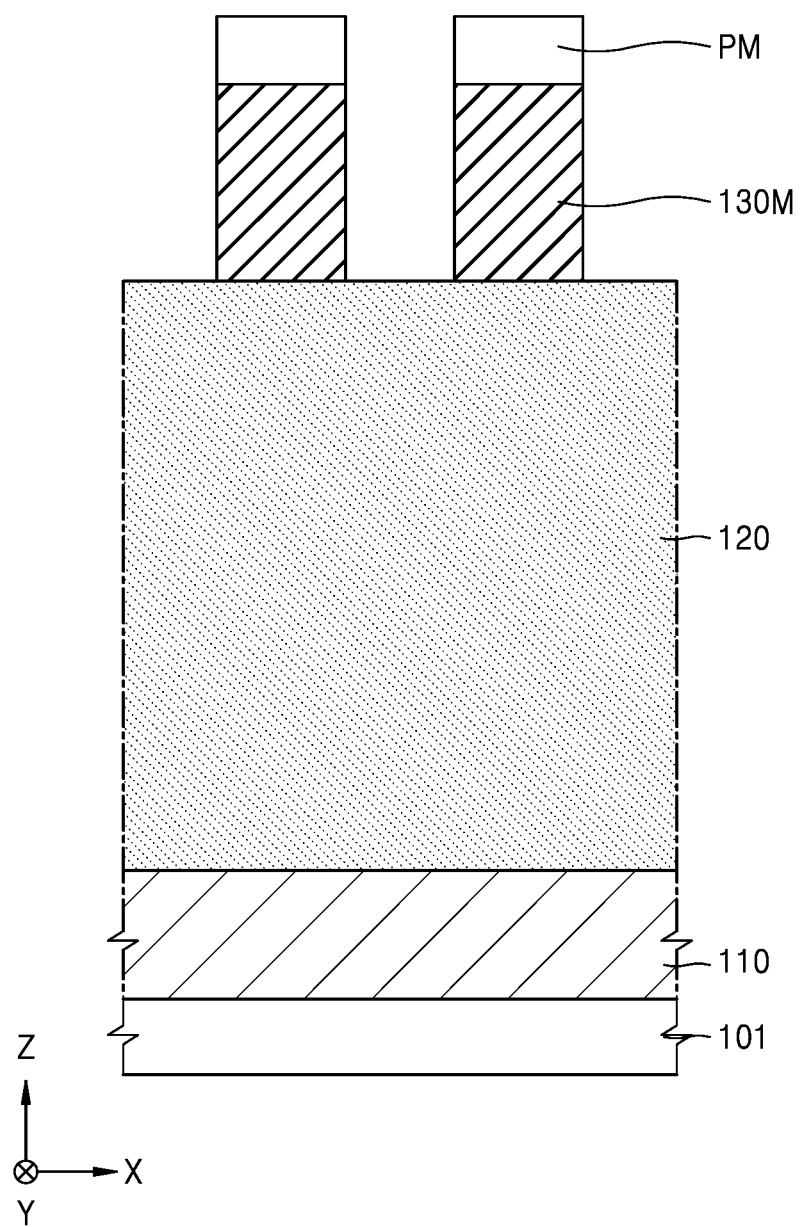

Referring to FIG. 3, the upper hard-mask forming layer 130 (see FIG. 2) may be etched by using the photomask pattern PM as an etch mask, thereby forming an upper hard-mask pattern 130M.

In some embodiments, when an ARC is formed on the upper hard-mask forming layer 130 (see FIG. 2), an anti-reflective pattern may be formed by etching the ARC as well.

The etching process set forth above may be a dry-etching process using plasma. Specifically, plasma may be sprayed toward the semiconductor substrate 101 and may include ions and/or radicals of a process gas, and thus, the plasma may function as etching-purpose plasma for etching the upper hard-mask forming layer 130 (see FIG. 2) formed on the semiconductor substrate 101. In some embodiments, the plasma may etch the upper hard-mask forming layer 130.

Figure 4:
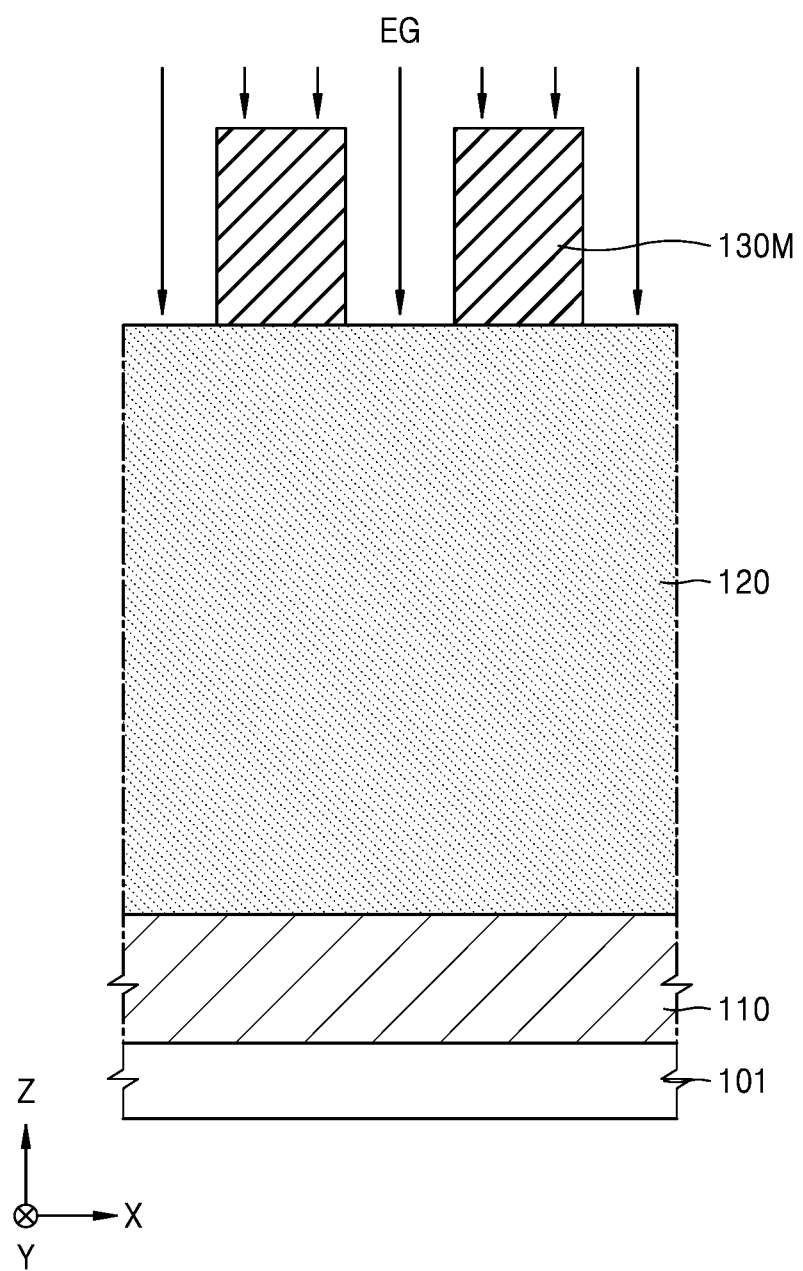

Referring to FIG. 4, the photomask pattern PM (see FIG. 3) may be removed by ashing and strip processes.

Next, the lower hard-mask forming layer 120 may be etched by using the upper hard-mask pattern 130M as an etch mask and using, as an etching gas EG, a first gas, which is metal-chloride-based, and a second gas, which is nitride-based. In some embodiments, the first gas may include metal and chlorine, and the second gas may include nitrogen.

In some embodiments, the lower hard-mask forming layer 120 may be etched, for example, using, as the etching gas EG, a first-state gas (①) including both the metal-chloride-based first gas and the nitride-based second gas and a second-state gas (②) including the metal-chloride-based first gas and not including the nitride-based second gas.

In an embodiment of the present invention, the metal-chloride-based first gas may include titanium chloride (e.g., titanium tetrachloride $TiCl_4$), and the nitride-based second gas may include ammonia ($NH_3$). Here, a chemical reaction formula for the reaction of the lower hard-mask forming layer 120 with the first-state gas (①) and the second-state gas (②) is as follows.

①, First-State Gas

Chemical reaction formula: Lower hard-mask forming layer ($SiB_3$+Si)+$O_2$+First gas ($TiCl_4$)+Second gas ($NH_3$)→$B_2O_3$+$SiO_2$+$TiO_2$+TiN+$BCl_3$(↑)+$SiCl_4$(↑)+ HCl(↑)+$NH_4Cl$(↑)

②, Second-State Gas

Chemical reaction formula: Lower hard-mask forming layer ($SiB_3$+Si)+$O_2$+First gas ($TiCl_4$)→$B_2O_3$+$SiO_2$+$TiO_2$+ $BCl_3$ (↑)+$SiCl_4$(↑)

In some embodiments, the lower hard-mask forming layer 120 may be etched by using, as an etching gas, only a third-state gas (③) including both the metal-chloride-based first gas and the nitride-based second gas. Here, a chemical reaction formula for the reaction of the lower hard-mask forming layer 120 with the third-state gas (③) is as follows.

③ Third-State Gas

Chemical reaction formula: Lower hard-mask forming layer ($SiB_3$+Si)+$O_2$+First gas ($TiCl_4$)+Second gas ($NH_3$)→$B_2O_3$+$SiO_2$+$TiO_2$+TiN+$BCl_3$(↑)+$SiCl_4$(↑)+ HCl(↑)+$NH_4Cl$(↑)

That is, the chemical reaction formula for the reaction of the lower hard-mask forming layer 120 with the third-state gas (③) may be substantially the same as the chemical reaction formula for the reaction of the lower hard-mask forming layer 120 with the first-state gas (①). However, although the first-state gas (①) and the second-state gas (②) may be alternately used, the third-state gas (③) may be used alone. In some embodiments, the etching gas may consist of the third-state gas (③). The first-state gas, the second-state gas, and the third-state gas may be also referred to as a first etching gas, a second etching gas, and a third etching gas, respectively.

Figure 5:
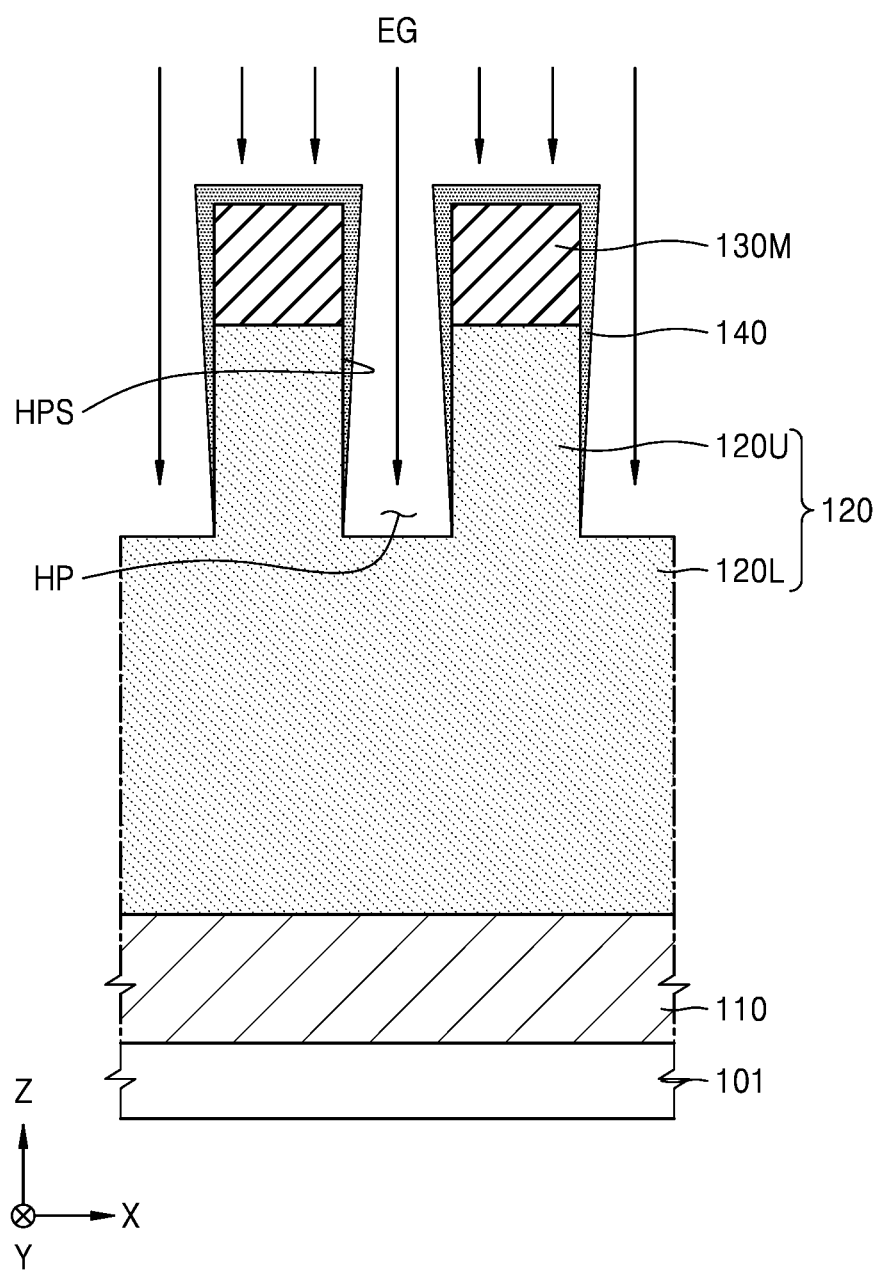

Referring to FIG. 5, a situation, in which the etching of the lower hard-mask forming layer 120 is performed from early to middle stages, is illustrated.

The lower hard-mask forming layer 120 may be divided into an upper layer 120U having been etched and a lower layer 120L having not yet been etched. Even during a period from the early to middle stages of the etching of the lower hard-mask forming layer 120, ion scattering may occur at an inner sidewall HPS of a hole pattern HP formed in the upper layer 120U of the lower hard-mask forming layer 120. That is, when the lower hard-mask forming layer 120 includes a material having high selectivity, because the lower hard-mask forming layer 120 has a relatively less reduction in thickness thereof than a hard-mask forming layer having low selectivity during the etching of the lower hard-mask forming layer 120, ion scattering may occur at the inner sidewall HPS of the hole pattern HP formed in the upper layer 120U of the lower hard-mask forming layer 120 from the early stage of the etching.

To minimize an effect due to the ion scattering, in an embodiment of the present invention, a protective layer 140, which is metal-nitride-based, may be formed along a sidewall of the upper hard-mask pattern 130M and a sidewall of the upper layer 120U of the lower hard-mask forming layer 120, both corresponding to the inner sidewall HPS of the hole pattern HP. Here, a metal included in the etching gas EG may be the same as a metal included in the protective layer 140.

As described above, in an embodiment of the present invention, because the metal-chloride-based first gas may include titanium chloride (e.g., titanium tetrachloride $TiCl_4$) and the nitride-based second gas may include ammonia ($NH_3$), the protective layer 140 may include titanium nitride (TiN). The protective layer 140 is formed as a by-product of the etching gas EG, and there is no need for an additional process of forming the protective layer 140. In some embodiments, the protective layer 140 may be a by-product of the etching process using the etching gas EG.

Figure 6:
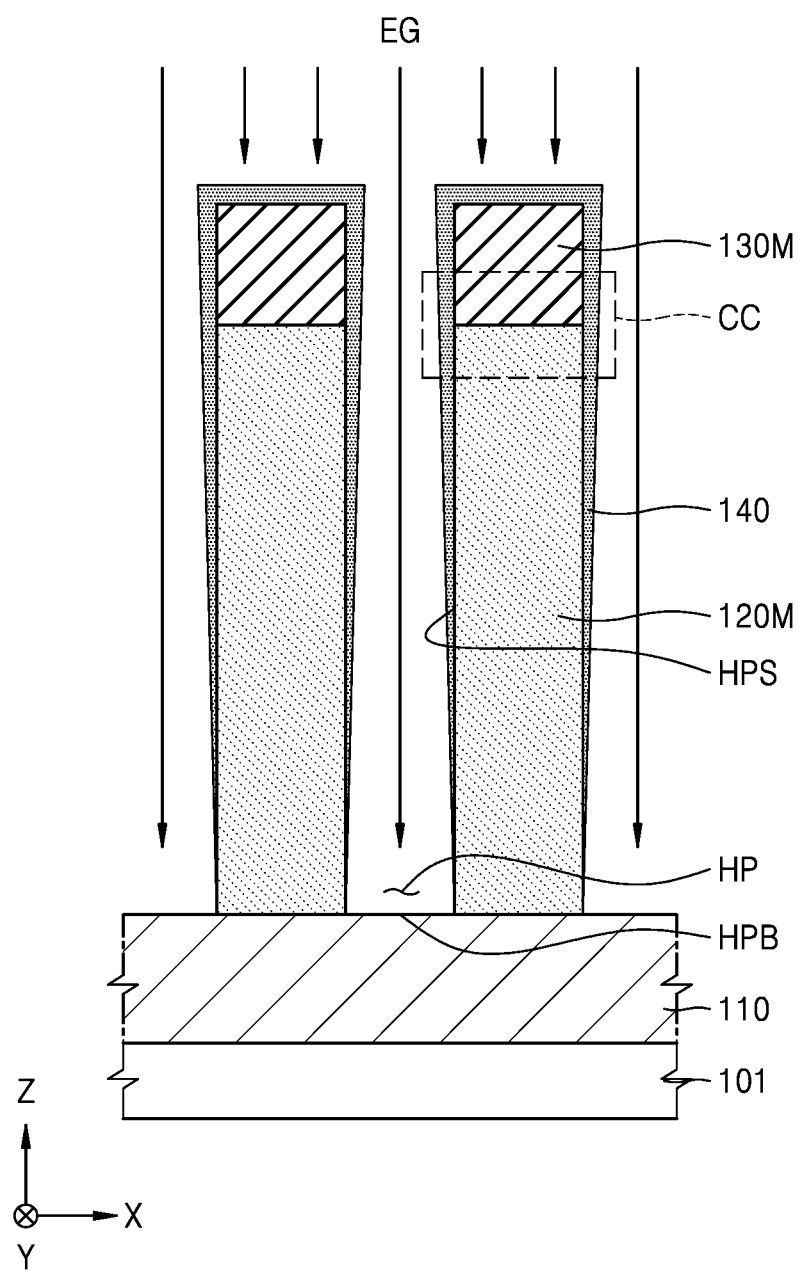
Figure 7:
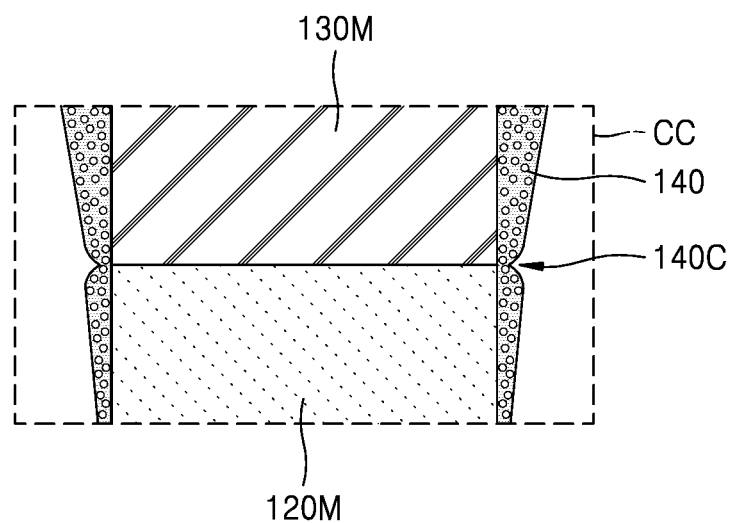

Referring together to FIGS. 6 and 7, a situation, in which the etching of the lower hard-mask forming layer 120 (see FIG. 5) is performed from middle to late stages, is illustrated.

The lower hard-mask forming layer 120 (see FIG. 5) may be etched by using the upper hard-mask pattern 130M as an etch mask, thereby forming a lower hard-mask pattern 120M.

Because a change, due to the etching, in thickness of the lower hard-mask forming layer 120 (see FIG. 5) including a material having high selectivity is relatively small in a period from the middle to later stages of the etching of the lower hard-mask forming layer 120 (see FIG. 5), there may still be a place, in which ion scattering mainly occurs, at the inner sidewall HPS of the hole pattern HP formed in the lower hard-mask forming layer 120.

Thus, even when the etching is performed by as much as a significant depth in the lower hard-mask forming layer 120 (see FIG. 5), ion scattering may occur at the inner sidewall HPS of the hole pattern HP formed in the lower hard-mask forming layer 120 throughout the etching process.

As described above, in an embodiment of the present invention, the metallic protective layer 140 may be formed along the sidewall of the upper hard-mask pattern 130M and the sidewall of the lower hard-mask pattern 120M, both corresponding to the inner sidewall HPS of the hole pattern HP.

In addition, etching ions may perform etching up to a bottom HPB of the hole pattern HP while having high straightness along the metallic protective layer 140 formed on the sidewall of the lower hard-mask pattern 120M. Accordingly, due to charge relaxation at the bottom HPB of the hole pattern HP, a charge effect of radical ions (e) generated in a plasma etching process may be reduced.

In an embodiment of the present invention, because a material constituting the upper hard-mask pattern 130M is different from a material constituting the lower hard-mask pattern 120M, a forming rate of the protective layer 140 in an interface region therebetween may be relatively lower than that in other regions. Thus, the protective layer 140 may have an uneven portion 140C in the interface region between the upper hard-mask pattern 130M and the lower hard-mask pattern 120M. The uneven portion 140C of the protective layer 140 may have a concave shape. In some embodiments, the protective layer 140 comprises a first surface facing the upper hard-mask pattern 130M and the lower hard-mask pattern 120M and a second surface opposite the first surface, and the second surface comprises a recess adjacent the interface between the upper hard-mask pattern 130M and the lower hard-mask pattern 120M, as illustrated in FIG. 7. Accordingly, the protective layer 140 may include a portion that is adjacent the interface between the upper hard-mask pattern 130M and the lower hard-mask pattern 120M and has a thickness thinner than an adjacent portion of the protective layer 140, as illustrated in FIG. 7.

According to the present invention, by this series of processes, the metallic protective layer 140 capable of protecting the inner sidewall HPS of the hole pattern HP may be formed in the process of forming the lower hard-mask pattern 120M from the silicon (Si)-based lower hard-mask forming layer 120 (see FIG. 5), thereby effectively improving a poor mask profile that may be generated in the lower hard-mask pattern 120M.

Figure 8:
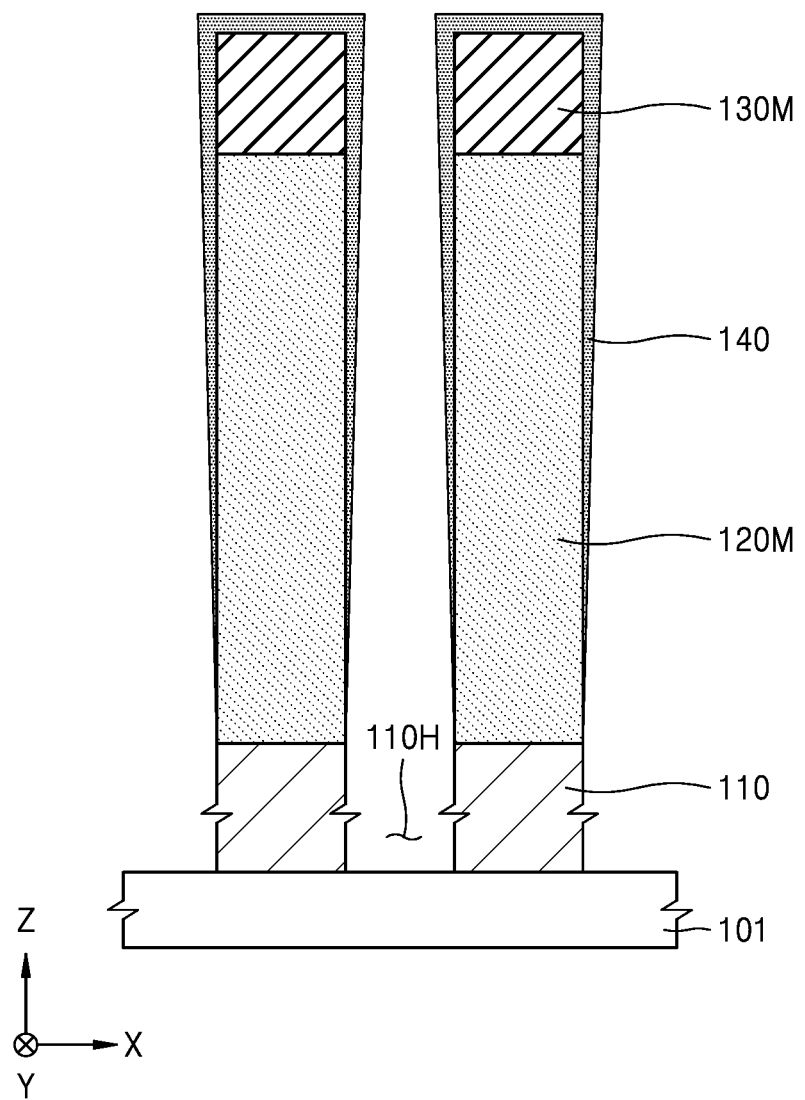

Referring to FIG. 8, the material layer 110 may be etched by using the upper hard-mask pattern 130M and the lower hard-mask pattern 120M as an etch mask, thereby forming a plurality of contact holes 110H in the material layer 110.

In some embodiments, the plurality of contact holes 110H may be formed through the material layer 110, and thus, a portion of a top surface of the semiconductor substrate 101 may be exposed. Although a thickness of the material layer 110 and aspect ratios of the plurality of contact holes 110H are shown as being low in the figures for convenience of description, the present invention is not limited thereto.

Figure 9:
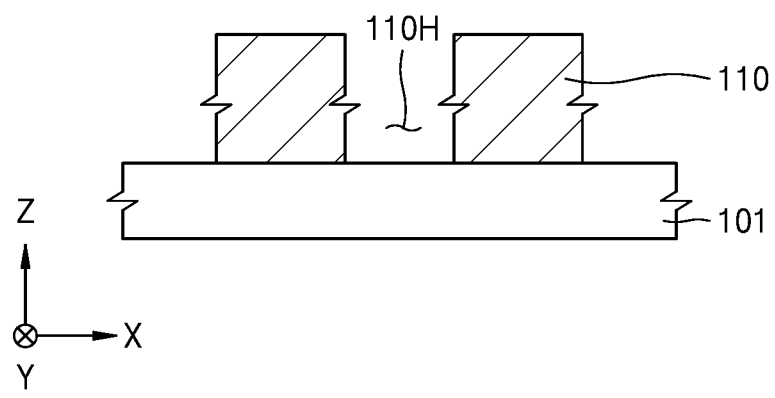

Referring to FIG. 9, the upper hard-mask pattern 130M (see FIG. 8) and the lower hard-mask pattern 120M (see FIG. 8) may be removed, thereby completing a process of forming a fine pattern, such as the plurality of contact holes 110H, in the material layer 110.

Both the upper hard-mask pattern 130M (see FIG. 8) and the lower hard-mask pattern 120M (see FIG. 8) may be removed by, for example, a wet-etching process. The wet-etching process may be performed by using a wet-etching solution such as a hydrofluoric acid solution and/or a buffered oxide etchant (BOE) solution. The wet-etching process may be performed such that an influence on the material layer 110 and the plurality of contact holes 110H is reduced or minimized.

Referring again to FIG. 1, according to the method S10 of forming a pattern of a semiconductor device, in accordance with the present invention, a metallic protective layer capable of protecting a sidewall of a hard-mask pattern may be formed in the process of performing dry etching for forming a high-aspect-ratio contact hole in an etching target layer by using the hard-mask pattern that is silicon (Si)-based, thereby improving a poor hard-mask profile generated in forming the high-aspect-ratio contact hole.

Figure 10:
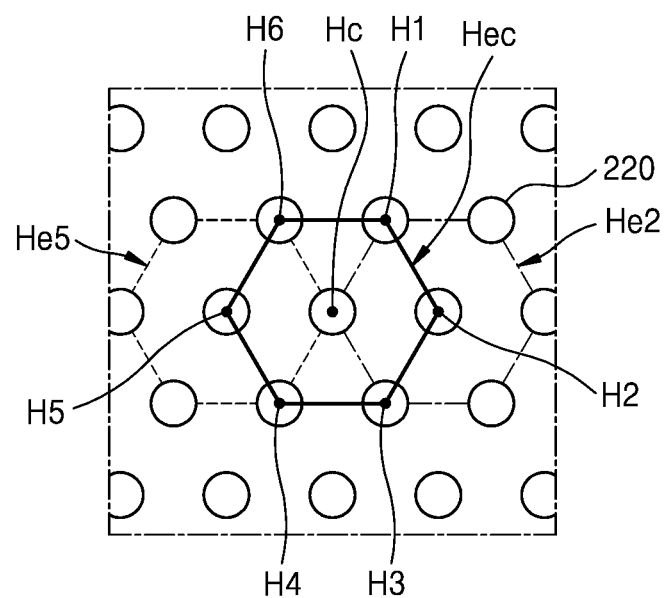
FIG. 10 is a conceptual diagram illustrating a honeycomb-structured arrangement of a plurality of conductors (e.g., lower electrodes) in a semiconductor device manufactured by a method of forming a semiconductor device, according to an embodiment of the present invention.

FIG. 10 is a conceptual diagram illustrating a honeycomb-structured arrangement of a plurality of lower electrodes in a semiconductor device manufactured by a method of forming a pattern of a semiconductor device, according to an embodiment of the present invention.

Referring to FIG. 10, a plurality of lower electrodes 220 may be arranged respectively at first to sixth vertices H1, H2, H3, H4, H5, and H6 of a hexagon and a central point Hc of the hexagon to form a honeycomb structure. In addition, the plurality of lower electrodes 220 may be arranged in a structure in which honeycomb structures are repeatedly arranged in a first direction (X direction) and a second direction (Y direction) to overlapp each other, as illustrated.

Specifically, the plurality of lower electrodes 220 may be arranged in a structure, in which the first to sixth vertices H1, H2, H3, H4, H5, and H6 of a central hexagon Hec (shown by a solid line) become respective central points of six adjacent hexagons, and in which the central point Hc of the central hexagon Hec is shared by the six hexagons.

For example, the second vertex H2 may be a central point of a second hexagon He2 (shown by a dash-dotted line), the fifth vertex H5 may be a central point of a fifth hexagon He5 (shown by a dashed line), and the central point Hc of the central hexagon Hec may be shared, by the second hexagon He2 and the fifth hexagon He5, as one of six vertices of each thereof.

Here, the hexagon of the honeycomb structure formed by the plurality of lower electrodes 220 may be a regular hexagon. In addition, all six triangles sharing the central point Hc of the hexagon may be equilateral triangles. Accordingly, in one hexagon, distances between adjacent vertices or distances between each vertex and a central point may be equal to each other.

In the plurality of lower electrodes 220, an aspect ratio, which is a ratio of a width (e.g., a diameter) in an X-Y plane to a height in a third direction (Z direction), may be extremely large. For example, the aspect ratio of each of the plurality of lower electrodes 220 may be about 10 to about 30. In addition, the diameter of each of the plurality of lower electrodes 220, in the X-Y plane, may be, for example, about 20 nm to about 100 nm, and the height of each of the plurality of lower electrodes 220, in the third direction (Z direction), may be, for example, about 500 nm to about 4000 nm. It is noted that the structure of the plurality of lower electrodes 220 is not limited to the numerical values set forth above.

FIGS. 11A to 14B are diagrams illustrating a method of manufacturing a semiconductor device, according to an embodiment of the present invention.

Specifically, FIGS. 11A, 12A, 13A, and 14A are plan views illustrating the method of manufacturing a semiconductor device, according to an embodiment of the present invention. In addition, FIGS. 11B, 12B, 13B, and 14B are cross-sectional views taken along lines B-B' of FIGS. 11A, 12A, 13A, and 14A, respectively.

Figure 11A:
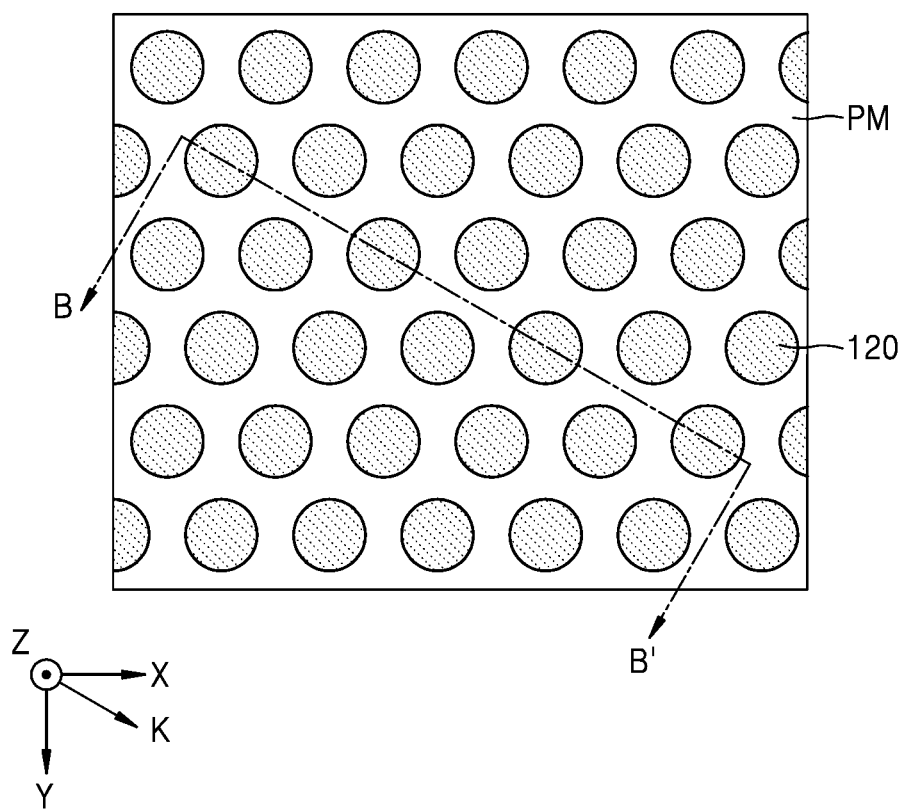
FIGS. 11A, 11B, 12A, 12B, 13A, 13B, 14A and 14B are diagrams illustrating a method of manufacturing a semiconductor device, according to an embodiment of the present invention.
Figure 11B:
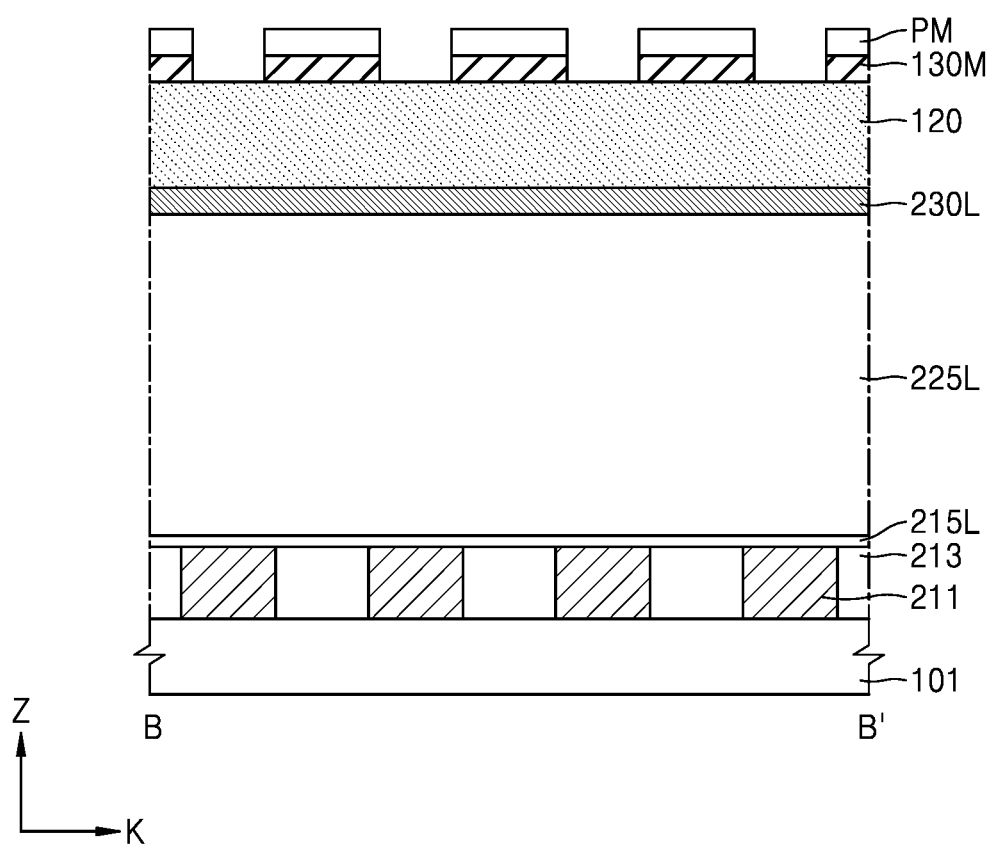

Referring together to FIGS. 11A and 11B, a contact plug 211 may be formed in an ILD 213 on the semiconductor substrate 101, an etch stop layer 215L may be formed on top surfaces of the ILD 213 and the contact plug 211, and then, a mold layer 225L may be formed on a top surface of the etch stop layer 215L.

The semiconductor substrate 101 may include, for example, a semiconductor such as silicon (Si) or germanium (Ge). In some embodiments, the semiconductor substrate 101 may include a compound semiconductor such as SiGe, SiC, GaAs, InAs, or InP. Because descriptions of the semiconductor substrate 101 are substantially the same as given above with reference to FIG. 2, detailed descriptions thereof are omitted here.

The mold layer 225L may include, for example, silicon oxide. For example, the mold layer 225L may include a material such as BPSG, an SOD, PSG, LPTEOS, and/or PE-TEOS. The mold layer 225L may have, for example, but is not limited to, a thickness of about 500 nm to about 4000 nm.

Next, a support forming layer 230L may be formed on the mold layer 225L. The support forming layer 230L may include, for example, a material such as silicon nitride and/or polysilicon. The support forming layer 230L may have, for example, but is not limited to, a thickness of about 20 nm to about 150 nm.

Next, the lower hard-mask forming layer 120 may be formed on the support forming layer 230L. Because descriptions of the lower hard-mask forming layer 120 are substantially the same as given above with reference to FIG. 2, detailed descriptions thereof are omitted here.

Next, an upper hard-mask forming layer may be formed on the lower hard-mask forming layer 120, followed by applying a photoresist on the upper hard-mask forming layer and patterning the photoresist by exposure and development processes, thereby forming the photomask pattern PM.

A region, in which the plurality of lower electrodes 220 (see FIG. 10) are to be formed, may be defined by the photomask pattern PM. Because descriptions of the upper hard-mask forming layer are substantially the same as given above with reference to FIG. 2, detailed descriptions thereof are omitted here. In addition, an ARC (not shown) may be formed on the upper hard-mask forming layer.

Next, the upper hard-mask forming layer may be etched by using the photomask pattern PM as an etch mask, thereby forming the upper hard-mask pattern 130M. When the ARC is formed on the upper hard-mask forming layer, an anti-reflective pattern is formed by etching the ARC as well.

Figure 12A:
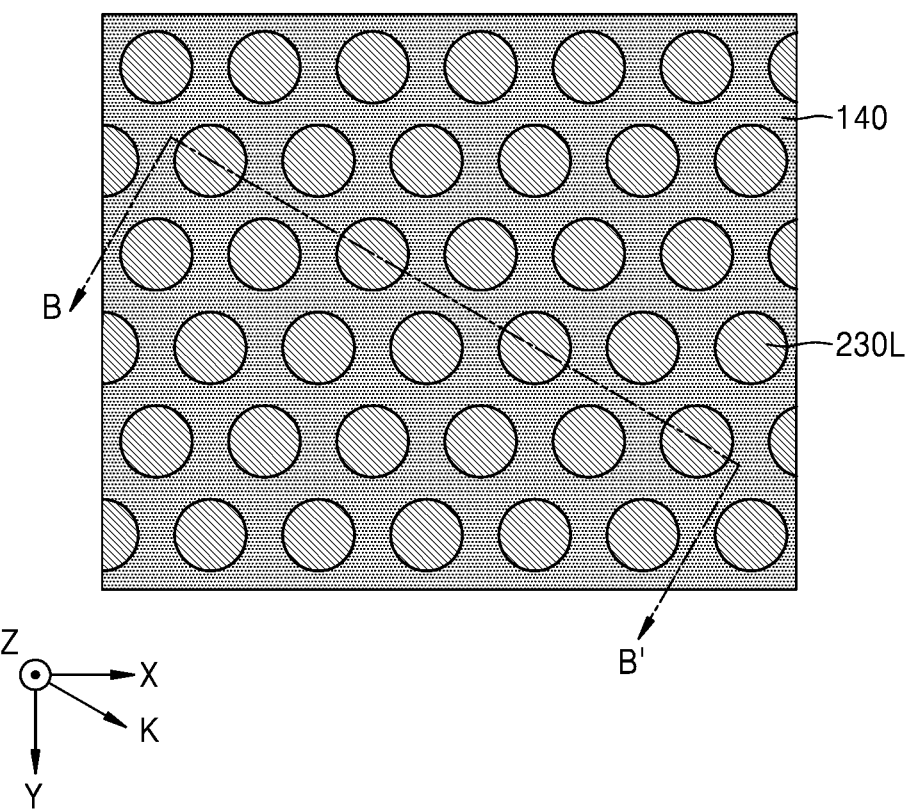
Figure 12B:
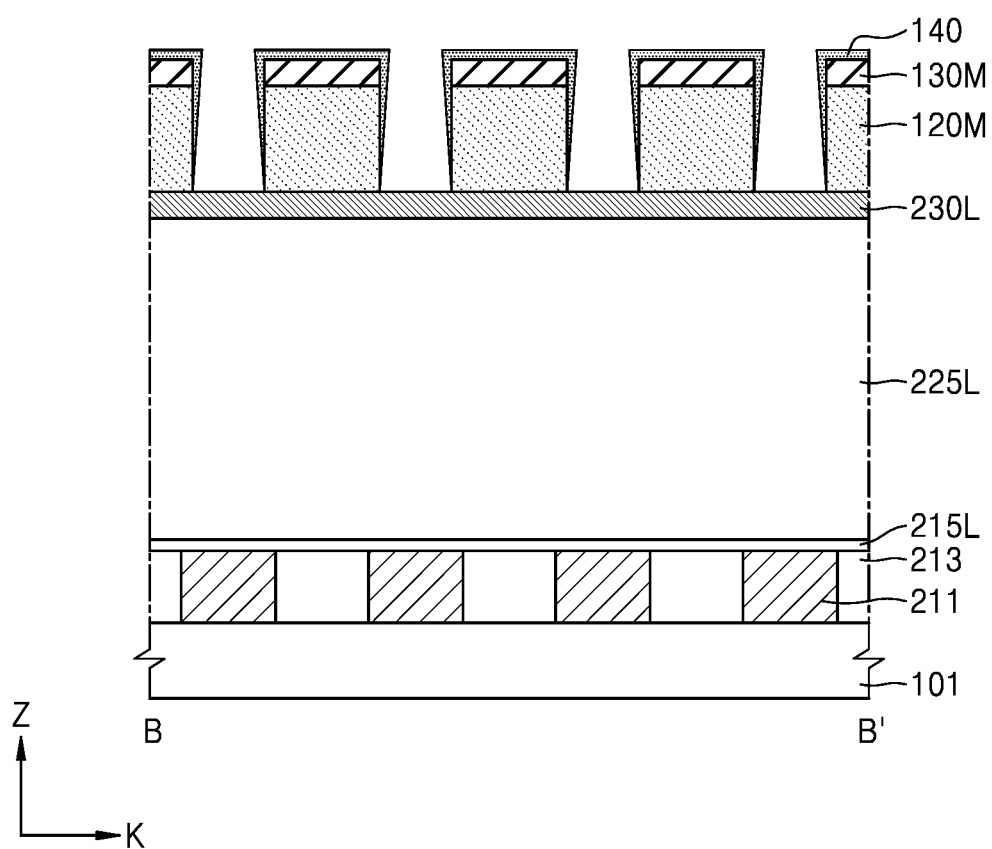

Referring together to FIGS. 12A and 12B, the photomask pattern PM (see FIG. 11B) is removed, and then, the lower hard-mask forming layer 120 (see FIG. 11B) may be etched by using the upper hard-mask pattern 130M as an etch mask, thereby forming the lower hard-mask pattern 120M.

The lower hard-mask forming layer 120 (see FIG. 11B) may be etched by using the upper hard-mask pattern 130M as an etch mask and using, as the etching gas EG, a first gas, which is metal-chloride-based, and a second gas, which is nitride-based.

In some embodiments, the lower hard-mask forming layer 120 (see FIG. 11B) may be etched by alternately using, as the etching gas EG, a first-state gas, which includes both the metal-chloride-based first gas and the nitride-based second gas, and a second-state gas, which includes the metal-chloride-based first gas and does not include the nitride-based second gas.

In an embodiment of the present invention, the protective layer 140, which is metal-nitride-based, may be formed along the sidewall of the upper hard-mask pattern 130M and the sidewall of the lower hard-mask pattern 120M. In some embodiments, the protective layer 140 may include titanium nitride (TiN). The protective layer 140 is formed as a by-product of the etching gas EG, and there is no need for an additional process of forming the protective layer 140. In some embodiments, the protective layer 140 may be a by-product of the etching process using the etching gas EG.

Figure 13A:
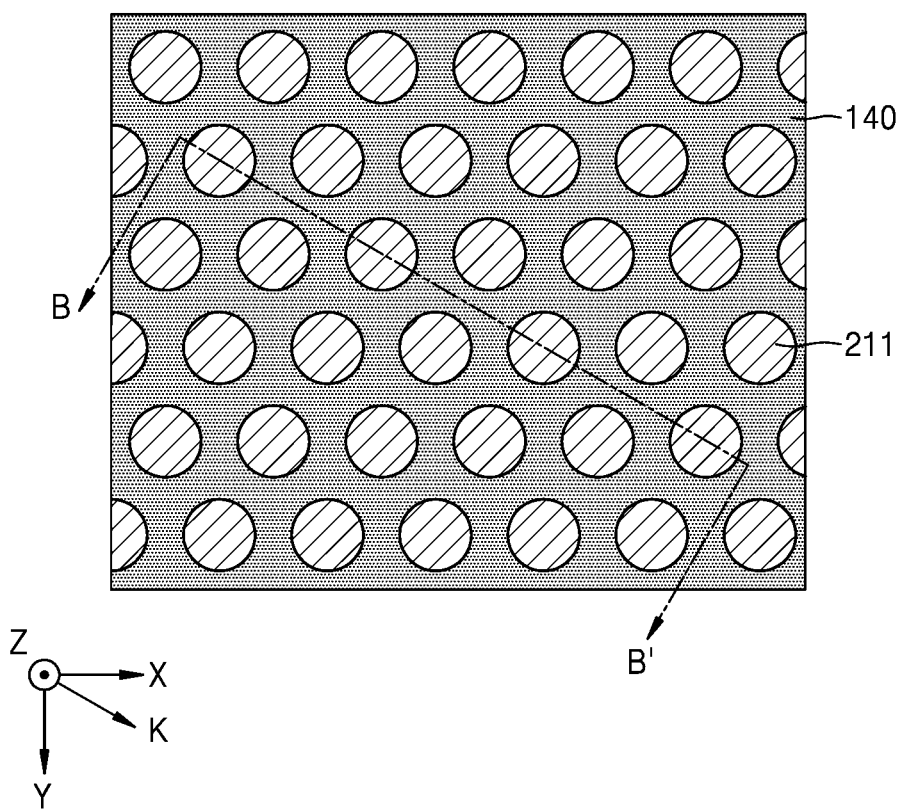
Figure 13B:
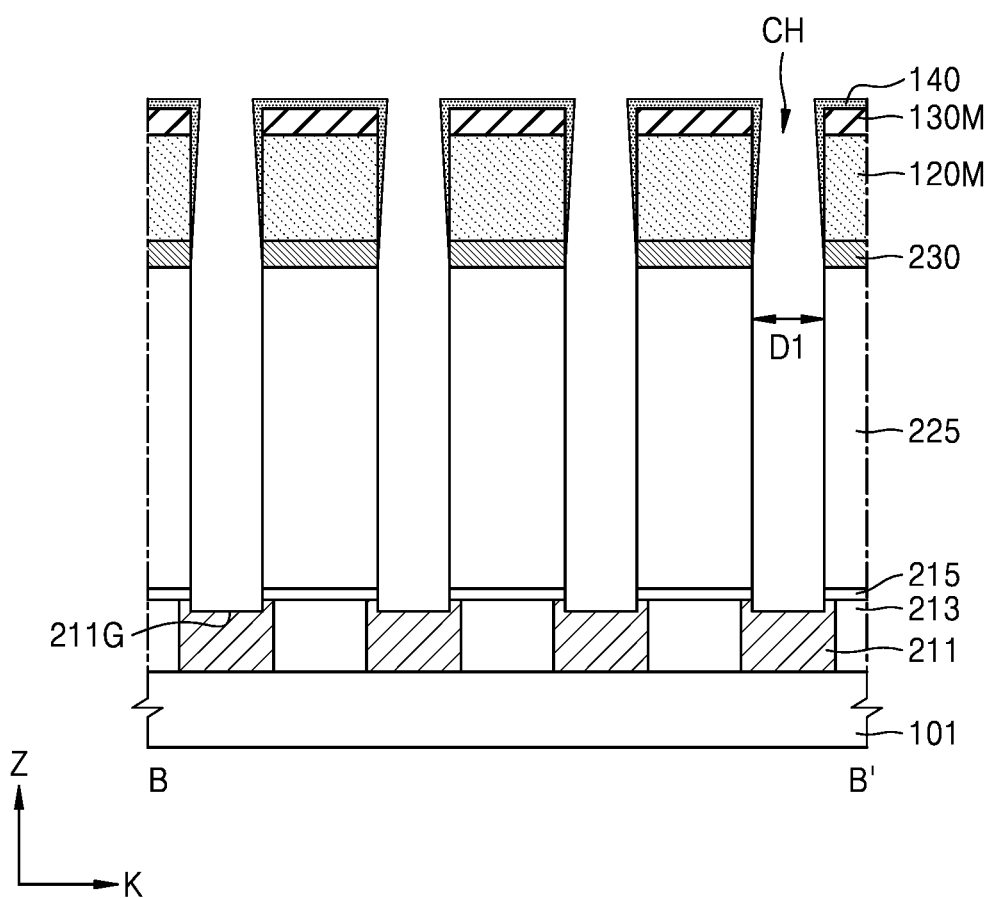

Referring together to FIGS. 13A and 13B, the support forming layer 230L (see FIG. 12B), the mold layer 225L (see FIG. 12B), and the etch stop layer 215L (see FIG. 12B) may be sequentially etched in the stated order by using the upper hard-mask pattern 130M and the lower hard-mask pattern 120M as an etch mask.

Accordingly, a plurality of contact holes CH may be formed, and the top surface of the contact plug 211 may be exposed by a contact hole CH. The contact hole CH may have a first diameter D1. By the etching set forth above, the support forming layer 230L may become a support pattern layer 230, the mold layer 225L may become a mold pattern 225, and the etch stop layer 215L may become an etch stop pattern 215.

When the mold layer 225L (see FIG. 12B) is dry-etched, the plurality of contact holes CH may each have a shape having a decreasing width from an upper end thereof toward a lower end thereof. However, for convenience of description, a vertically shaped contact hole is illustrated. In some embodiments, a groove 211G may be formed at the top surface of the contact plug 211 by over-etch. In some embodiments, no groove may be formed at the top surface of the contact plug 211.

Figure 14A:
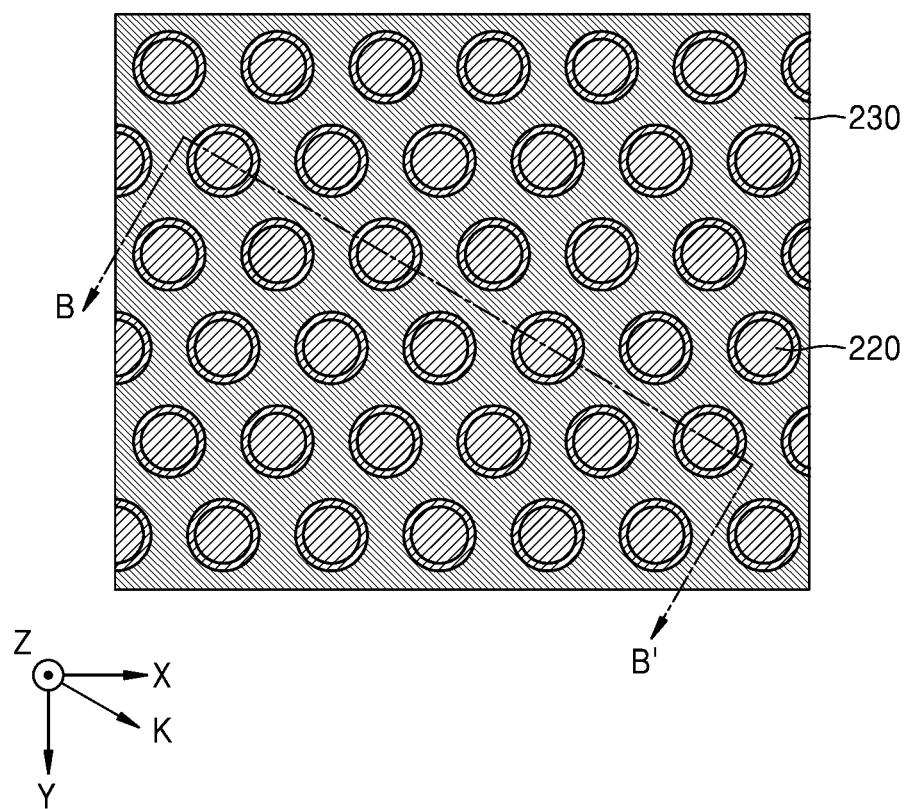
Figure 14B:
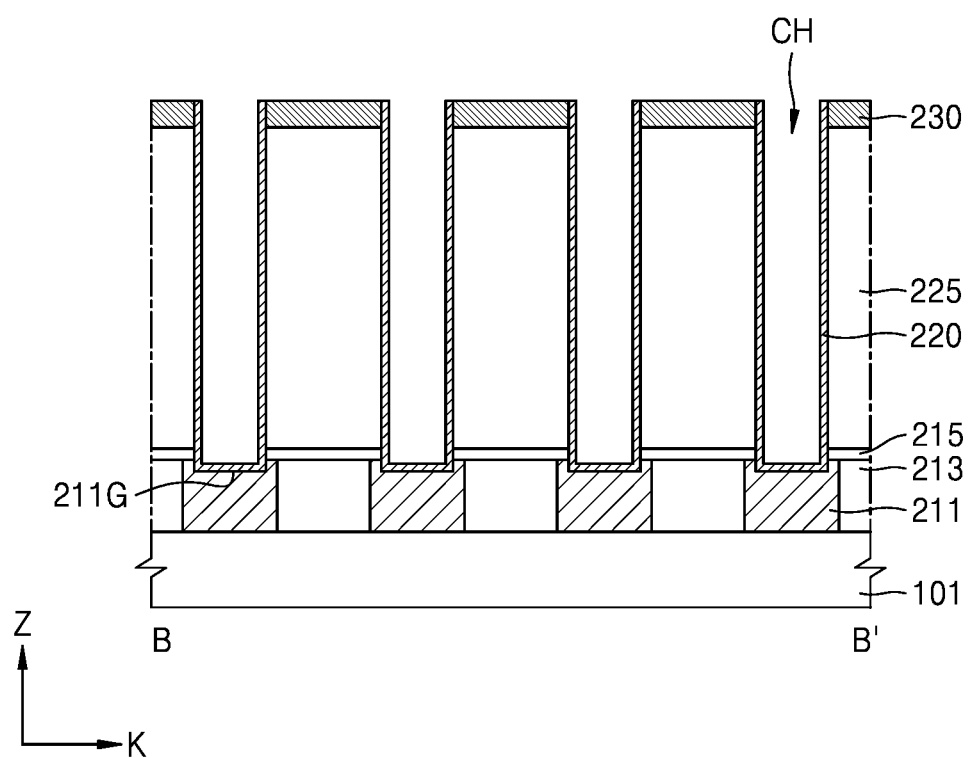

Referring together to FIGS. 14A and 14B, the upper hard-mask pattern 130M (see FIG. 13B) and the lower hard-mask pattern 120M (see FIG. 13B) are removed, and then, a conductive material, which is to be used as a lower electrode, may be conformally formed on a whole surface of a resulting product.

Next, a node separation process is performed, thereby forming the plurality of lower electrodes 220 with cylindrical shapes along bottom surfaces and lateral surfaces of the plurality of contact holes CH. The node separation process may use an etch-back method and/or a chemical mechanical polishing (CMP) method.

The conductive material, which is to become the plurality of lower electrodes 220, may include one of a metal nitride, a metal, and a combination thereof. For example, the conductive material may include at least one selected from among TiN, Ru, TaN, WN, Pt, and Ir. The conductive material may be formed by a chemical vapor deposition (CVD) method or an atomic layer deposition (ALD) method, and may have a thickness of about 20 nm to about 100 nm.

The plurality of lower electrodes 220 adjacent to each other may be insulated and separated from each other by the mold pattern 225. When each of the plurality of contact holes CH has a shape having a decreasing width from an upper end thereof toward a lower end thereof, such a shape may also be transferred to the plurality of lower electrodes 220. Thus, each of the plurality of lower electrodes 220 may have a shape having a decreasing width from an upper end thereof toward a lower end thereof.

The plurality of lower electrodes 220 may be formed such that a bottom portion of each lower electrode 220 is formed in and contacts the groove 211G. An outer wall of an upper-end portion of each of the plurality of lower electrodes 220 may be secured and supported by the support pattern layer 230.

In a semiconductor device manufactured by the method of forming a pattern of a semiconductor device, according to an embodiment of the present invention, a metallic protective layer capable of protecting a sidewall of a hard-mask pattern is formed in the process of performing dry etching for forming the high-aspect-ratio contact hole CH in an etching target layer by using the hard-mask pattern that is silicon (Si)-based, and thus, the high-aspect-ratio contact hole CH may be formed in a desired shape.

It should be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of the present invention.

While the invention has been particularly shown and described with reference to example embodiments thereof, it will be understood that various changes in form and details may be made therein without departing from the scope of the following claims.

What is claimed is:

1. A method of forming a semiconductor device, the method comprising:
    providing a substrate on which a layer is formed;
    forming a lower hard-mask layer on the layer, the lower hard-mask layer comprising silicon;
    forming an upper hard-mask pattern on the lower hard-mask layer, the upper hard-mask pattern comprising oxide;
    forming a lower hard-mask pattern by etching the lower hard-mask layer using the upper hard-mask pattern as an etch mask and using an etching gas that comprises a first gas comprising a metal-chloride and a second gas comprising nitrogen; and
    forming a plurality of contact holes in the layer by etching the layer using the lower hard-mask pattern as an etch mask.

2. The method of claim 1, wherein, while forming the lower hard-mask pattern, a protective layer comprising a metal nitride is formed along a sidewall of each of the upper and lower hard-mask patterns.

3. The method of claim 2, wherein the protective layer comprises an uneven surface adjacent an interface between the upper and lower hard-mask patterns.

4. The method of claim 2, wherein both the etching gas and the protective layer comprise titanium (Ti).

5. The method of claim 2, wherein the protective layer comprises a first surface facing the upper and lower hard-mask patterns and a second surface opposite the first surface, and
    the second surface comprises a recess adjacent an interface between the upper and lower hard-mask patterns.

6. The method of claim 1, wherein, while forming the lower hard-mask pattern, a first etching gas and a second etching gas are alternately supplied as the etching gas,
    the first etching gas comprises both the first and second gases, and
    the second etching gas comprises the first gas and is devoid of the second gas.

7. The method of claim 1, wherein the etching gas consists of a third etching gas that comprises both the first and second gases.

8. The method of claim 1, wherein the second gas is ammonia ($NH_3$) gas.

9. The method of claim 1, wherein a thickness of the lower hard-mask pattern is greater than a thickness of the upper hard-mask pattern.

10. The method of claim 1, wherein the lower hard-mask layer comprises silicon boride.

11. A method of forming a semiconductor device, the method comprising:
    providing a substrate;
    forming a mold layer and a support layer on the substrate;
    forming a mask layer on the support layer;
    forming a mask pattern by etching the mask layer using an etching gas that comprises titanium tetrachloride ($TiCl_4$) gas and ammonia ($NH_3$) gas;
    forming a plurality of contact holes exposing the substrate, by etching the mold layer and the support layer using the mask pattern as an etch mask; and
    forming a plurality of conductors by forming a conductive material in each of the plurality of contact holes.

12. The method of claim 11, wherein, while forming the mask pattern, a protective layer comprising titanium nitride (TiN) is formed along a sidewall of the mask pattern.

13. The method of claim 12, wherein the mask pattern comprises an upper mask pattern and a lower mask pattern, the upper and lower mask patterns comprising different materials from each other, and
    the protective layer comprises an uneven surface adjacent an interface between the upper and lower mask patterns.

14. The method of claim 12, wherein the mask pattern comprises an upper mask pattern and a lower mask pattern, the upper and lower mask patterns comprising different materials from each other,
    the protective layer comprises a first surface facing the upper and lower mask patterns and a second surface opposite the first surface, and
    the second surface comprises a recess adjacent an interface between the upper and lower mask patterns.

15. The method of claim 11, wherein, while forming the mask pattern, a first etching gas and a second etching gas are alternately supplied as the etching gas, the first etching gas comprises both titanium tetrachloride (TiCl$_4$) gas and ammonia (NH$_3$) gas, and the second etching gas comprises titanium tetrachloride (TiCl$_4$) gas and is devoid of ammonia (NH$_3$) gas.

16. A method of forming a semiconductor device, the method comprising:
providing a substrate on which a layer is formed;
forming a lower hard-mask layer on the layer, the lower hard-mask layer comprising silicon boride and silicon (Si);
forming an upper hard-mask layer on the lower hard-mask layer, the upper hard-mask layer comprising silicon oxide;
forming a photoresist pattern on the upper hard-mask layer;
forming an upper hard-mask pattern by etching the upper hard-mask layer using the photoresist pattern as an etch mask;
removing the photoresist pattern;
forming a lower hard-mask pattern by etching the lower hard-mask layer using the upper hard-mask pattern as an etch mask and using an etching gas that comprises titanium tetrachloride (TiCl$_4$) gas and ammonia (NH$_3$) gas;
forming a plurality of contact holes in the layer by etching the layer using the upper and lower hard-mask patterns as an etch mask; and
removing the upper and lower hard-mask patterns.

17. The method of claim 16, wherein, while forming the lower hard-mask pattern, a protective layer comprising titanium nitride (TiN) is formed from the etching gas along a sidewall of each of the upper and lower hard-mask patterns.

18. The method of claim 17, wherein the protective layer comprises a portion having an uneven surface adjacent an interface between the upper and lower hard-mask patterns, the portion having a thickness thinner than an adjacent portion of the protective layer.

19. The method of claim 16, wherein, while forming the lower hard-mask pattern, a first etching gas and a second etching gas are alternately supplied as the etching gas, and
the first etching gas comprises both titanium tetrachloride (TiCl$_4$) gas and ammonia (NH$_3$) gas, and the second etching gas comprises titanium tetrachloride (TiCl$_4$) gas and is devoid of ammonia (NH$_3$) gas.

20. The method of claim 16, wherein the etching gas consists of a third etching gas that comprises both titanium tetrachloride (TiCl$_4$) gas and ammonia (NH$_3$) gas.

* * * * *